United States Patent
Lin et al.

(10) Patent No.: US 7,777,240 B2
(45) Date of Patent: Aug. 17, 2010

(54) OPTOELECTRONIC DEVICE

(75) Inventors: Jin-Ywan Lin, Hsinchu (TW);
Jen-Chau Wu, Hsinchu (TW);
Chih-Chiang Lu, Hsinchu (TW);
Wei-Chih Peng, Hsinchu (TW);
Ching-Pu Tai, Hsinchu (TW); Shih-I Chen, Hsinchu (TW)

(73) Assignee: Epistar Corporation (TW)

( * ) Notice: Subject to any disclaimer, the term of this patent is extended or adjusted under 35 U.S.C. 154(b) by 0 days.

(21) Appl. No.: 12/318,195

(22) Filed: Dec. 23, 2008

(65) Prior Publication Data
US 2009/0108286 A1     Apr. 30, 2009

Related U.S. Application Data

(63) Continuation-in-part of application No. 11/550,332, filed on Oct. 17, 2006, now Pat. No. 7,488,988.

(51) Int. Cl.
*H01L 33/00* (2010.01)

(52) U.S. Cl. ............... 257/94; 438/22; 438/24

(58) Field of Classification Search ......... 257/79, 257/91, 9, 99, E33.065; 438/22, 24, 37
See application file for complete search history.

(56) References Cited

U.S. PATENT DOCUMENTS

| | | | | |
|---|---|---|---|---|
| 6,462,358 B1 * | 10/2002 | Lin et al. | ...... | 257/99 |
| 6,583,448 B2 * | 6/2003 | Lin et al. | ...... | 257/99 |
| 6,797,987 B2 * | 9/2004 | Chen | ...... | 257/98 |
| 6,853,011 B2 * | 2/2005 | Lin | ...... | 257/99 |
| 7,391,061 B2 * | 6/2008 | Shieh et al. | ...... | 257/99 |
| 2005/0236710 A1 * | 10/2005 | Akiyama et al. | ...... | 257/744 |
| 2008/0230791 A1 * | 9/2008 | Lin et al. | ...... | 257/91 |

* cited by examiner

*Primary Examiner*—Phuc T Dang
(74) *Attorney, Agent, or Firm*—Bacon & Thomas

(57) ABSTRACT

An optoelectronic device such as a light-emitting diode chip is disclosed. It includes a substrate, a multi-layer epitaxial structure, a first metal electrode layer, a second metal electrode layer, a first bonding pad and a second bonding pad. The multi-layer epitaxial structure on the transparent substrate comprises a semiconductor layer of a first conductive type, an active layer, and a semiconductor layer of a second conductive type. The first bonding pad and the second bonding pad are on the same level. Furthermore, the first metal electrode layer can be patterned so the current is spread to the light-emitting diode chip uniformly.

13 Claims, 12 Drawing Sheets

OPTOELECTRONIC DEVICE

REFERENCE TO RELATED APPLICATION

This application is a continuation-in-part application of U.S. patent application Ser. No. 11/550,332, filed Oct. 17, 2006, now allowed U.S. Pat. No. 7,488,988 (of which the entire disclosure of the prior application is hereby incorporated by reference) and claims the right of priority based on TW application Ser. No. 096109432, filed "Mar. 19, 2007", entitled "Optoelectric Device" and the contents of which are incorporated herein by reference.

TECHNICAL FIELD

The application relates to an optoelectronic device, and more particularly to a light-emitting diode device.

BACKGROUND

Light-emitting diode devices (LEDs) are extremely useful because they potentially offer lower power consumption and long term durability benefits over the conventional incandescent and fluorescent lamps and frequently provide a functional cost benefit, even when their initial cost is greater than that of conventional lamps. As well known, LEDs are widely used in different fields such as displays, traffic lights, data storage apparatus, communication apparatus, lighting apparatus, and medical apparatus.

The chip size of the light-emitting diode is increasing due to the improvement of the luminous efficiency and the simplification of the circuit design. The input current through the electrode is also increasing in the large-size light-emitting diode chip at a fixed current density. Therefore, the large-size light-emitting diode chip has a plurality of affiliated electrode in the corners or edges in the prior arts like the one shown in FIG. 5. However, the affiliated electrode design may incur the current crowding and the unstable voltage due to the incomplete bonding when using the eutectic bonding technique during packaging. Besides, when the wire bonding technique is applied, the bonding steps and chip packaging complexity are increasing as well.

SUMMARY

The present invention provides an optoelectronic device wherein a first bonding pad is electrically connected to a first conductive type semiconductor layer with a channel.

The present invention provides an optoelectronic device wherein a first bonding pad and a second bonding pad are on the same level and separated by an isolated trench.

The present invention provides an optoelectronic device wherein a chip plane is defined by the overlapping area of the chip surface and the planar surface where the first bonding pad and the second bonding pad are located on. The first bonding pad is disposed on the geometric center of the chip plane, and the second bonding pad is located on the chip plane with a predetermined distance to the geometric center of the chip plane. The structure of the present invention is suitable for all kinds of chip package techniques and it also has several advantages including the lower forward voltage and the higher luminous efficiency.

The present invention also provides an optoelectronic device such as a light-emitting diode chip comprising a multi-layer epitaxial structure, wherein the multi-layer epitaxial structure comprising a first conductive type semiconductor layer, an active layer, and a second conductive type semiconductor layer. The first conductive type of semiconductor layer has a channel to electrically connect between a first bonding pad and a first metal electrode layer. Besides, the first conductive type metal electrode layer is patterned so that the current is spread to the light-emitting diode chip uniformly.

Other features and advantages of the present invention and variations thereof will become apparent from the following description, drawing and claims.

BRIEF DESCRIPTION OF THE DRAWINGS

The accompanying drawings incorporated herein provide a further understanding of the invention therefore constitute a part of this specification. The drawings illustrating embodiments of the invention, together with the description, serve to explain the principles of the invention.

DETAILED DESCRIPTION OF A PREFERRED EMBODIMENTS

Figure 1:
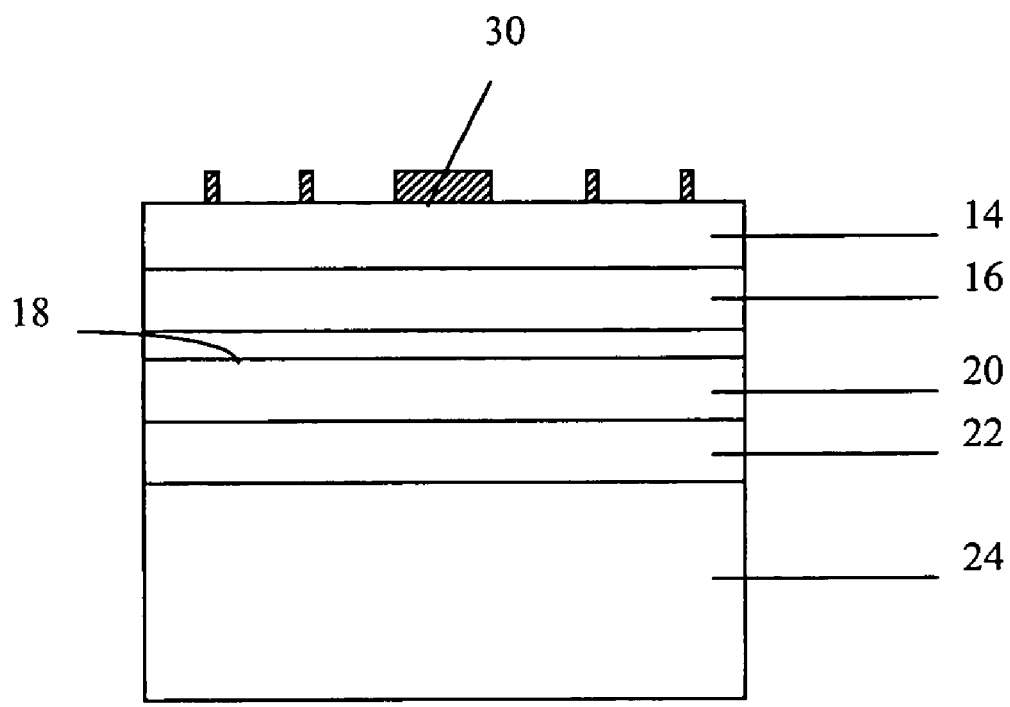
FIGS. 1-3 are the schematic diagrams illustrating the manufacturing procedure of the light-emitting diode chip.
Figure 2:
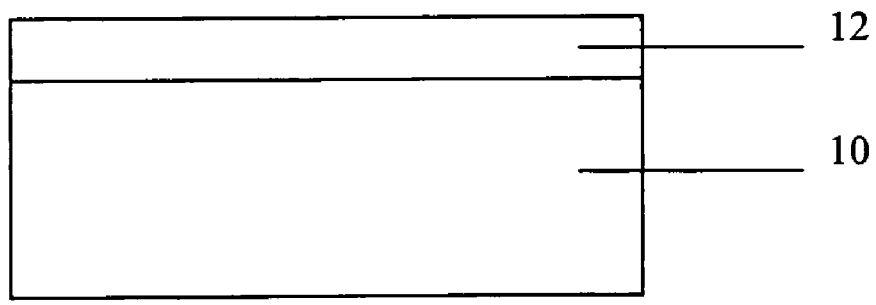
Figure 3:
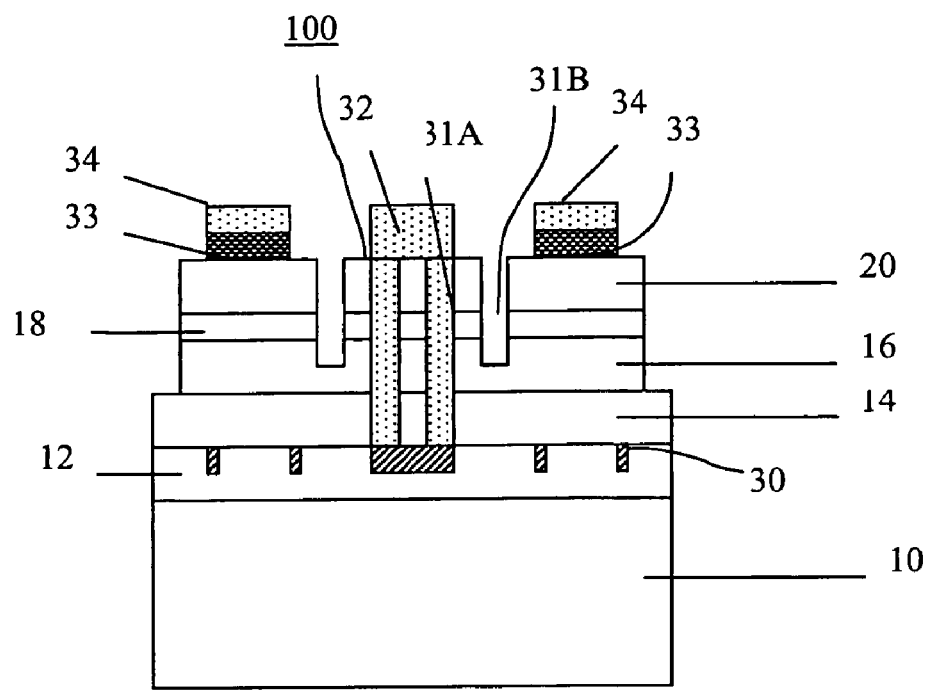

This invention discloses an optoelectronic device. In order to present the more detailed description of this invention, please refer to FIGS. 1-14 and the description hereinafter. FIGS. 1-3 show the fabricating procedures in one embodiment of this invention.

In accordance with FIG. 1, the optoelectronic device comprises an opaque substrate 24 like n-type GaAs, an etching stop layer 22, a lower cladding layer 20 like n-type $(Al_xGa_{1-x})_{0.5}In_{0.5}P$, an active layer 18 like $(Al_yGa_{1-y})_{0.5}In_{0.5}P$, an upper cladding layer 16 like p-type $(Al_zGa_{1-z})_{0.5}In_{0.5}P$ and a p-type ohmic contact epitaxy layer 14. Although the material of the aforementioned epitaxial layers in this embodiment is disclosed as AlGaInP, it doesn't mean the material of the epitaxial layers is limited to AlGaInP series. The epitaxial layers may consist of other different semiconductor materials, such as the GaN series. Besides, a p-type metal electrode layer 30 is formed on the p-type ohmic contact epitaxy layer 14. The band-gap of the p-type ohmic contact expitaxy layer 14 is larger than that of the active layer 18, and the p-type ohmic contact layer 14 is selected from the material which does not absorb the light that the active layer emits, such as AlGaAs, AlGaP, and GaAsP. Furthermore, the p-type ohmic contact epitaxy layer 14 has high carrier concentration for easily forming the ohmic contact. The material of the etching stop layer 22 may be selected from the III-V group semiconductor materials with a lattice constant substantially matched with the opaque substrate 24 and with a much smaller etching rate than the opaque substrate 24. In one preferred embodiment, the material of the etching stop layer 22 is InGaP or AlGaAs. Besides, if the etching rate of the lower cladding layer 20 is much smaller than that of the opaque substrate 24, the lower cladding layer 20 with sufficient thickness can serve as the etching stop layer, and no additional etching stop layer is required.

Then, in accordance with FIG. 2, a structure comprising a transparent substrate 10 and an adhesive layer 12 is formed. The transparent substrate 10 is selected from a group consisting of sapphire, glass, GaP, GaAsP, ZnSe, ZnS, ZnSSe, and SiC. Moreover, the transparent substrate 10 can be substituted as the metal substrate or the heat-dissipated substrate like silicon, ZnO, MgO, AlN or Cu. The adhesive layer 12 is selected from a group consisting of Epoxy, Polyimide (PI), Perfluorocylobutane (PFCB), Benzocyclobutene (BCB), Spin-on glass (SOG) and Silicone. The adhesive layer also may be substituted as a silver film or a conductive material containing conductive macromolecules, Al, Au, Pt, Zn, Ag, Ni, Ge, In, Sn, Ti, Pb, Cu or Pd.

Then, the p-type metal electrode layer 30 is orientated toward the adhesive layer 12, and the p-type metal electrode layer 30 is adhered to the transparent substrate 10. Subsequently, remove the opaque substrate 24 to expose the lower cladding layer 20 with the etching solution, such as $5H_3PO_4$: $3H_2O_2$:$3H_2O$ or $1\ NH_4OH$:$35H_2O_2$. If the etching stop layer 22 is composed of InGaP or AlGaAs, it must be removed entirely by the etching process because it may absorb the light that the active layer 18 emits.

In accordance with FIG. 3, at least one hole is formed by the lithography and etching technique to remove a portion of the lower cladding layer 20, the active layer 18 and the upper cladding layer 16 to expose the p-type metal electrode layer 30, and the hole is filled with Al or Au to form a channel 31A. Subsequently, an isolation trench 31B is formed by the lithography and etching technique to expose the upper cladding layer 16. Subsequently, forming a first bonding pad 32 and a second bonding pad 34 on the lower cladding layer 20.

FIG. 3 shows a preferred embodiment, wherein a chip plane 100 is defined by the overlapping area of the chip surface and the planar surface where the first bonding pad and second bonding pad are located on. The first bonding pad is on the geometric center of the chip plane 100 and is electrically connected with the p-type metal electrode layer 30 by the channel 31A. Besides, the n-type ohmic metal electrode layer 33 and the second bonding pad 34 are formed on the chip plane 100 with a predetermined distance to the geometric center, and the first bonding pad 32 and the second bonding pad 34 are separated by the isolation trench 32B.

Figure 4A:
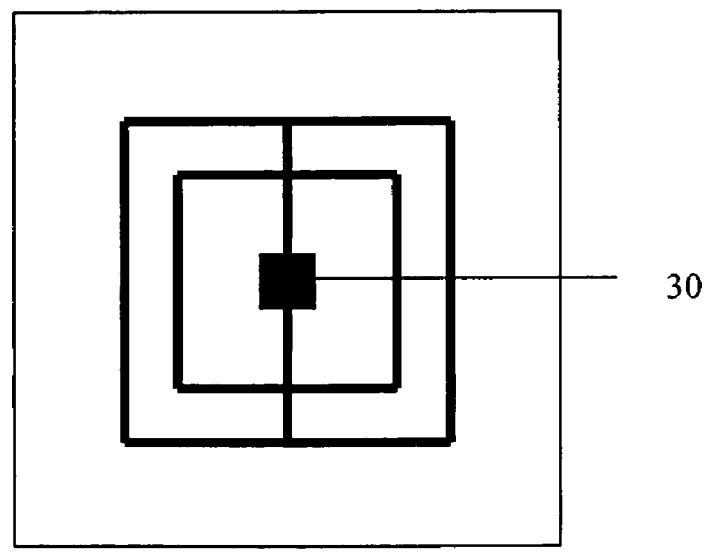
FIG. 4A is the schematic diagram illustrating the top view of the p-type metal electrode layer.
Figure 4B:
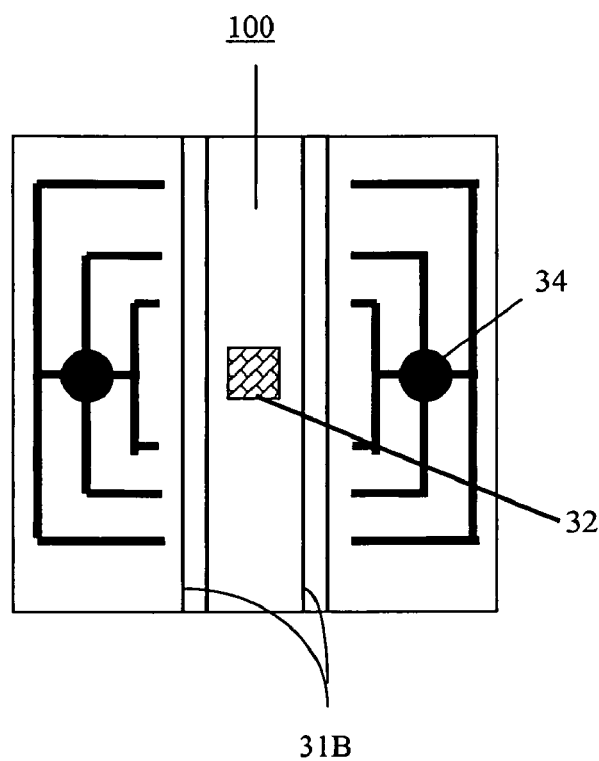
FIGS. 4B-4D are the schematic diagrams illustrating the top view of the first bonding pad and the second bonding pad in the present invention.
Figure 4C:
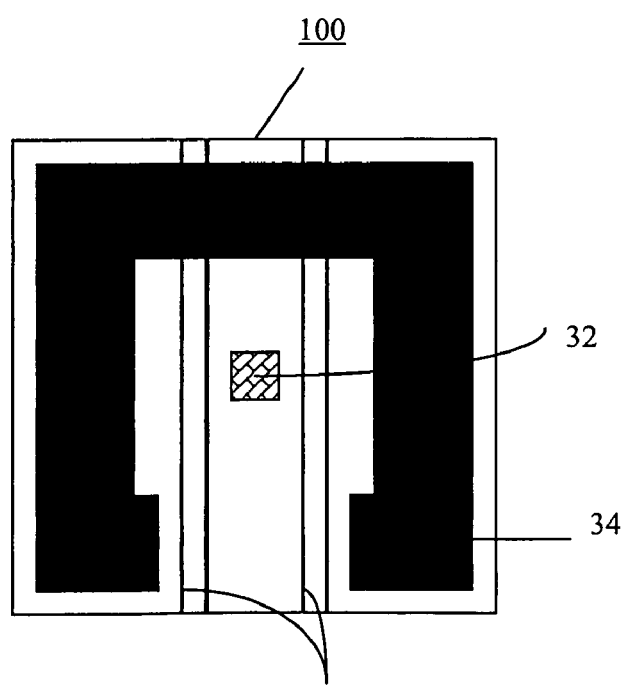
Figure 4D:
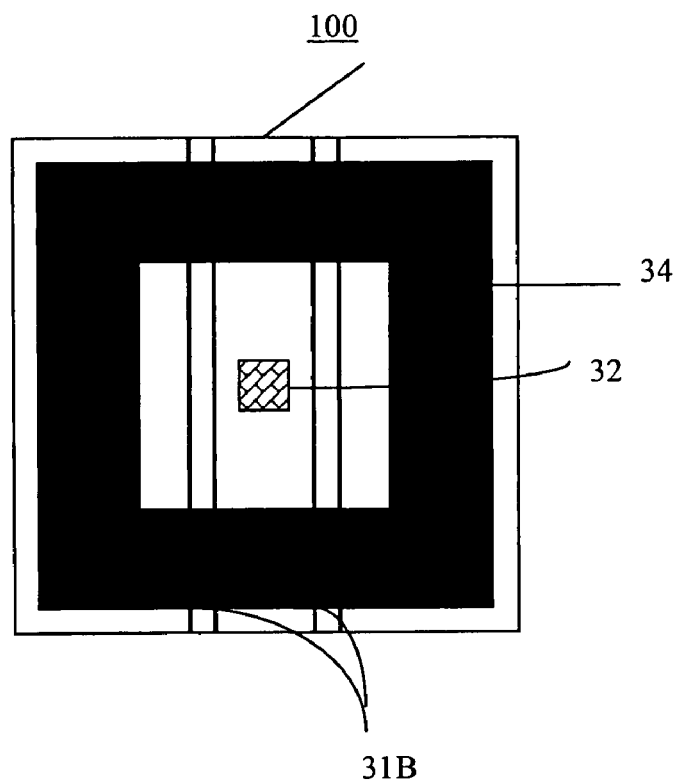

FIG. 4A is the top view of the first metal electrode layer pattern of one embodiment which is shown as FIG. 1. FIGS. 4B to 4D are the top views of the first bonding pad 32 and second bonding pad 34 in other embodiments, wherein both the first bonding pad 32 and the second bonding pad 34 are disposed on the chip plane 100 while the first bonding pad 32 is located on the geometric center of the chip plane 100, and the second bonding pad 34 is located on the chip plane 100 with a predetermined distance to the geometric center.

Furthermore, with reference to FIG. 4B, the summation of the area that first bonding pad 32 and the second bonding pad 34 occupy is less than 15% of the area of the chip plane 100. This kind of bonding pad design is suitable for the vertical type of light emitting diode. With reference to FIGS. 4C and 4D, the summation of the area that first bonding pad 32 and the second bonding pad 34 occupy is 65-80% of the area of the chip plane 100. This kind of bonding pad design is suitable for the flip-chip light emitting diode.

Figure 8:
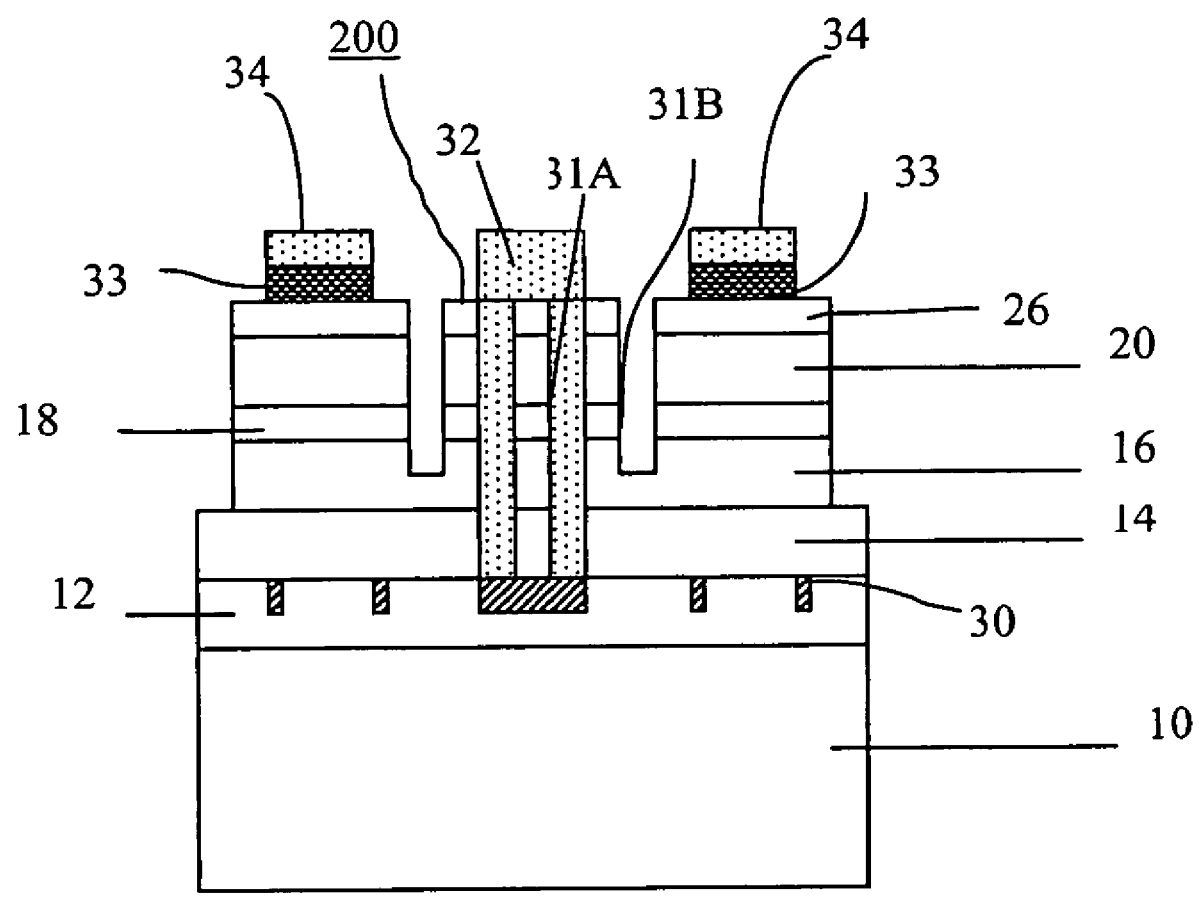
FIG. 8 is the schematic diagram illustrating another embodiment in the present invention.

For increasing the luminous efficiency of the flip-chip light emitting diode, the light emitting diode further comprises a reflective layer 26 between the lower cladding layer 20, the first bonding pad 32 and the second bonding pad 34 as shown in FIG. 8. There is a chip plane 200 on the reflective layer 26 wherein the chip plane has a geometric center. At least one hole with a width of 1-3 mil is formed by the lithography and etching technique to expose the p-type metal electrode layer 30. Then, the hole is filled with Au or Al to form the channel 31A. The isolation trench 31B with a width of 0.2-1 mil is also formed by the etching process to expose the upper cladding layer 16. Subsequently, the first bonding pad 32 which is electrically connected to the p-type metal electrode layer 30 with the channel 31A on the geometric center of the chip plane 200 is formed. Besides, an n-type metal electrode layer 33 and a second bonding pad 34 are located on the chip plane 200 with a predetermined distance to the geometric center of the chip plane 200, and the first bonding pad 32 and the second bonding pad 34 are separated by the isolated trench 31B.

Figure 5:
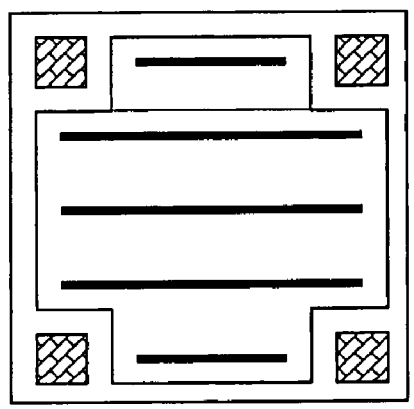
FIG. 5 is the schematic diagrams illustrating the top view of the conventional bonding pad structure.
Figure 6:
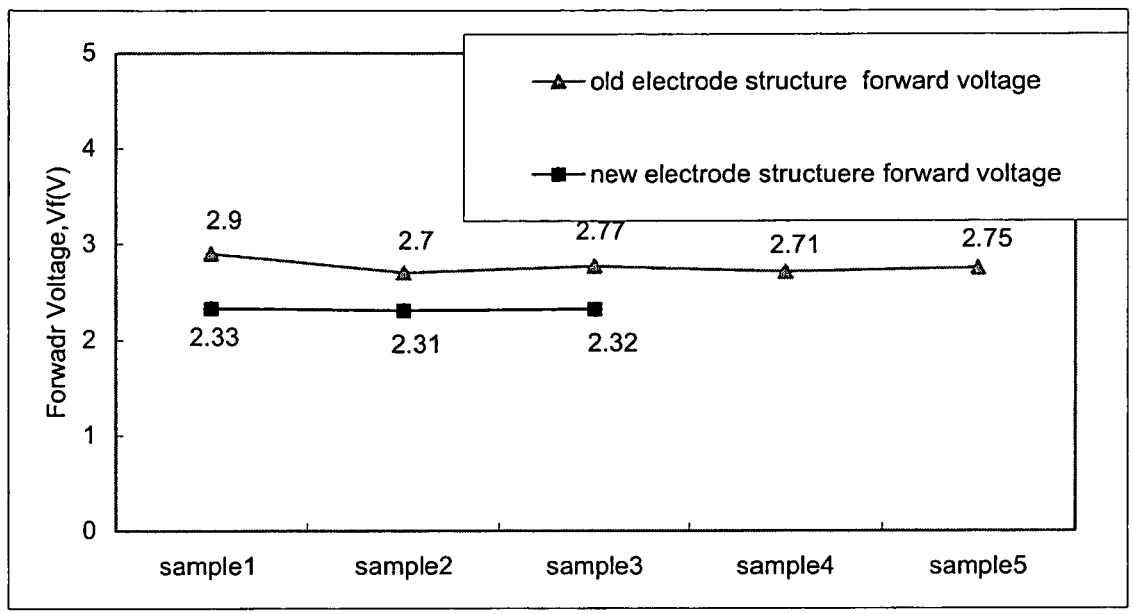
FIG. 6 is the schematic diagram illustrating the forward voltage of the conventional LED chip and the LED in the present invention.
Figure 7:
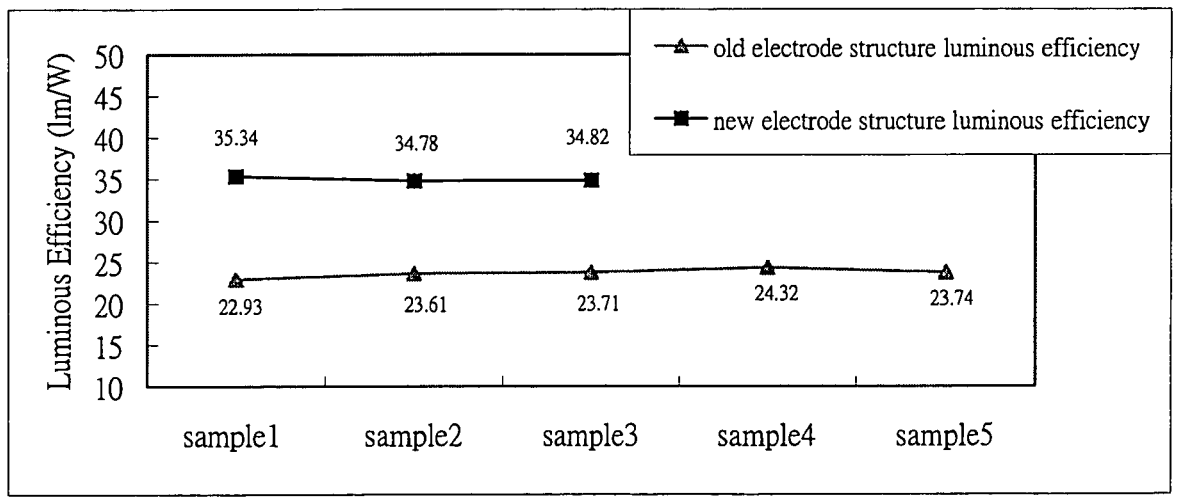
FIG. 7 is the schematic diagram illustrating the luminous efficiency of the conventional LED chip and the LED in the present invention.

FIG. 6-7 show the comparison of the forward voltage (Vf) and the luminous efficiency (lm/W) between the LED with the conventional bonding pad structure as shown in FIG. 5 and the LED in one embodiment of this invention as shown in FIG. 4C. When the current is 350 mA, the forward voltage is decreased from 2.75V to 2.32V, about 15% drop, and the luminous efficiency is increased from 23.7 lm/W to 34.8 lm/W, about 50% up. It shows that the light emitting diode of the present invention has a lower forward voltage and a higher luminous efficiency.

Figure 9A:
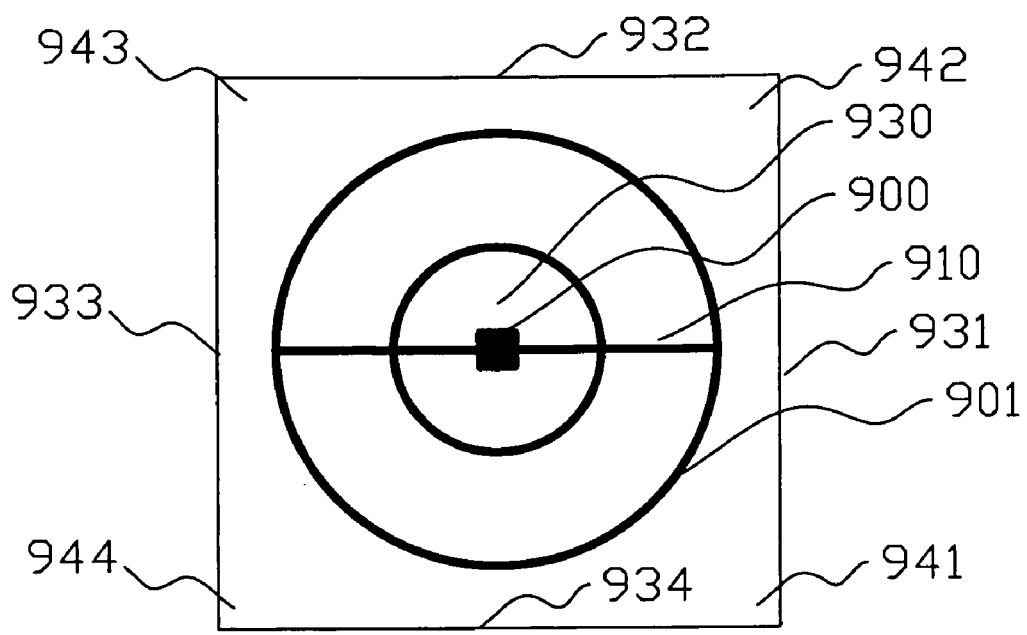
FIGS. 9A-9D are the schematic diagrams illustrating the embodiments which the channel-connecting portion is located on the center of the metal electrode layer.

Moreover, this invention also discloses different patterns of the p-type metal electrode layer 30 to spread the current uniformly. As shown in FIG. 9A, the plane which the p-type metal electrode layer 30 forms on comprises a center 930, four edges 931, 932, 933, 934 and four corners 941, 942, 943, 944, and the p-type metal electrode layer 30 comprises at least one channel-connecting portion 900.

FIGS. 9A-9D show some embodiments of the p-type metal electrode layer pattern, wherein the channel-connecting portion 900 is located on the center 930 and is electrically connected to the channel 31A.

Figure 9B:
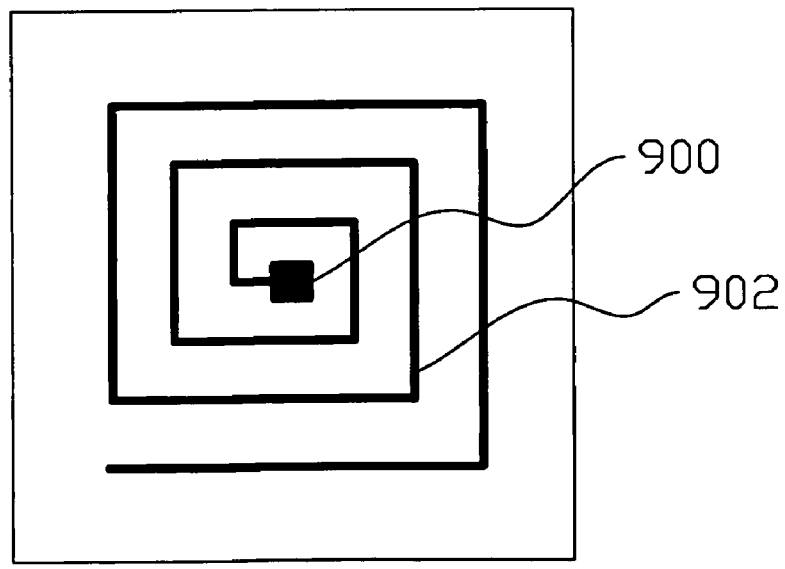
Figure 9C:
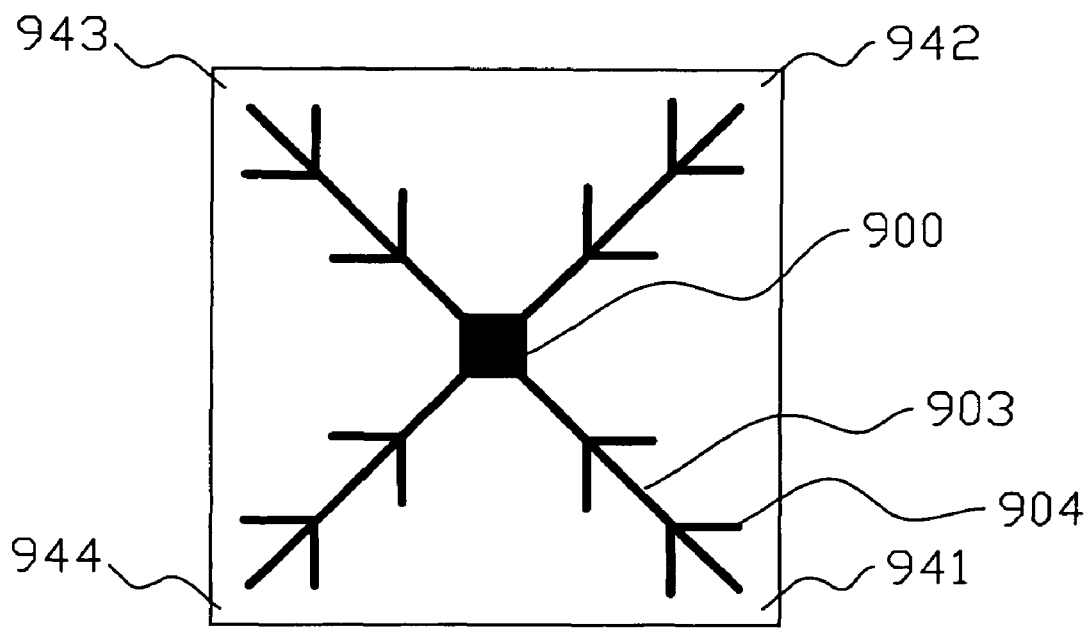
Figure 9D:
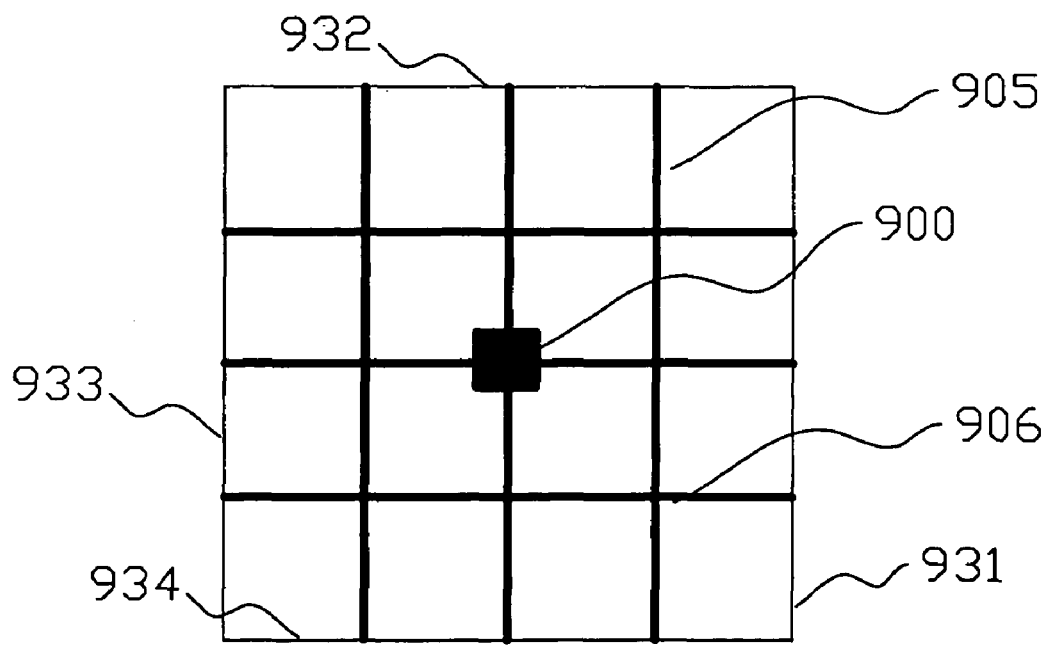

FIG. 9A shows a ring-shaped p-type metal electrode layer pattern comprising one or plural closed ring(s) 901 surrounding the center 930. Besides, this pattern further comprises one or plural connection arm(s) 910 to connect the different rings 901. FIG. 9B shows a spiral p-type metal electrode layer pattern, comprising at least one spiral portion 902 which surrounds the center 930 and extends outwards. Another p-type metal electrode layer pattern, shown in FIG. 9C comprises at least one finger-shaped electrode 903 extending form the center 930 to the corners 941, 942, 943, 944, and at least one extension portion 940 extending from the finger-shaped electrode 903. Still Another p-type metal electrode layer pattern comprises one or plural finger-shaped electrode(s) 905, 906 which are vertical or parallel to the four edges 931, 932, 933, 934, wherein the finger-shaped electrodes 905, 906 can further form a mesh pattern as shown in FIG. 9D.

Figure 10A:
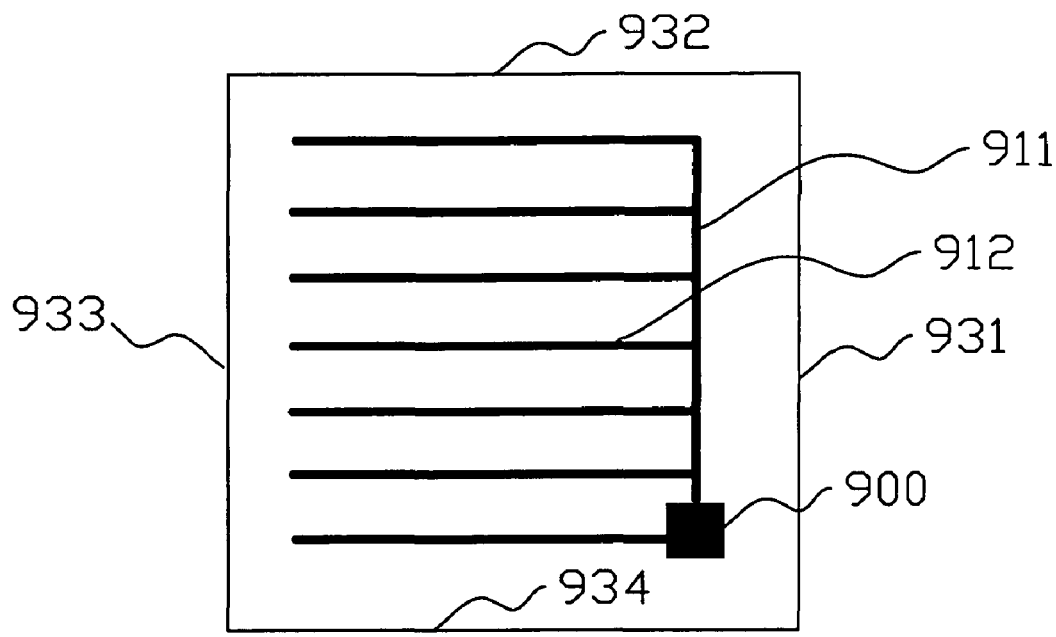
FIGS. 10A-10B are the schematic diagrams illustrating the embodiments which the channel-connecting portion is located on the corner of the metal electrode layer.
Figure 10B:
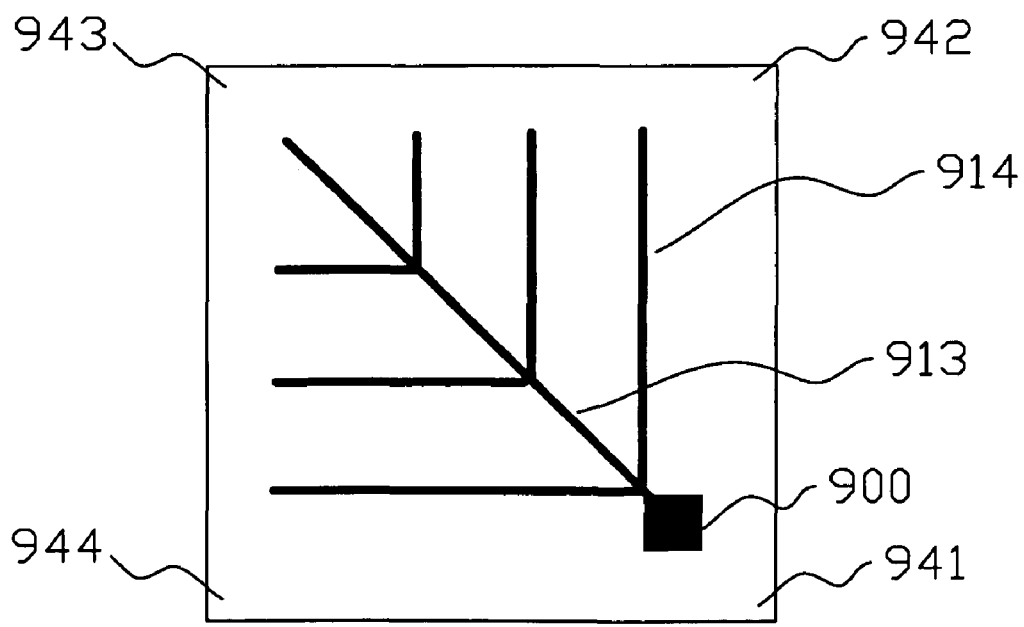

FIGS. 10A-10B show some embodiments of the p-type metal electrode layer pattern, wherein the channel-connecting portion 900 is located near the corner 941. FIG. 10A shows the p-type metal electrode layer pattern comprising one or plural finger-shaped electrodes 911, 912 which are vertical or parallel to the edges 931, 932, 933, 934, wherein the finger-shaped electrodes 911, 912 are extending toward the opposite edge and electrically connected to the channel-connecting portion 900. FIG. 10B shows another p-type metal electrode layer pattern comprising a finger-shaped electrode 913 extending from the channel-connecting portion 900 to the diagonal corner 943 and extension portions 914 extending from finger-shaped electrode 913 towards the edges.

Figure 11A:
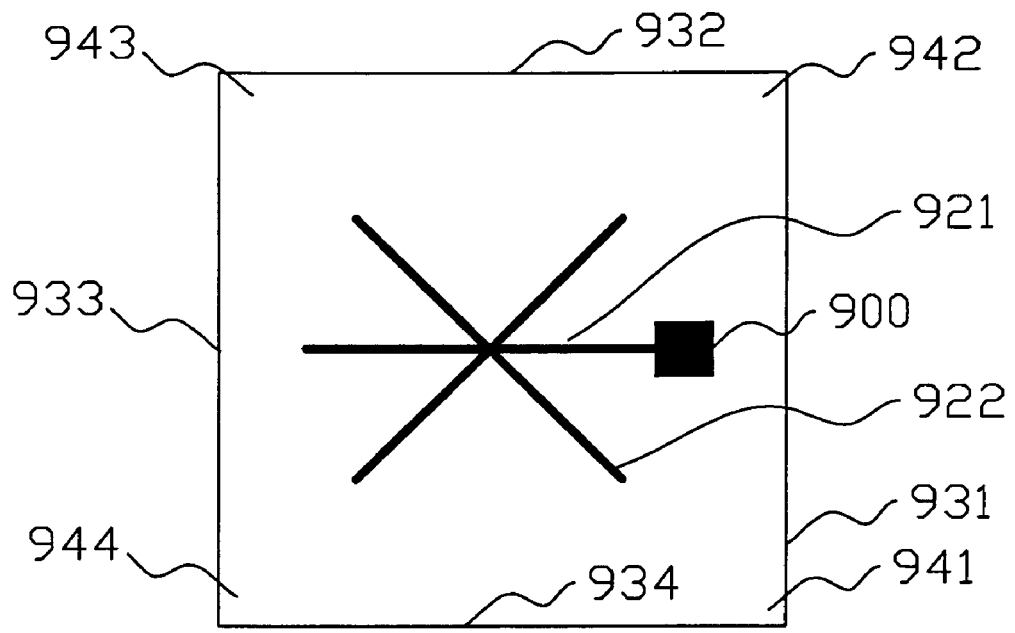
FIGS. 11A-11C are the schematic diagrams illustrating the embodiments which the channel-connecting portion is located on the edge of the metal electrode layer.
Figure 11B:
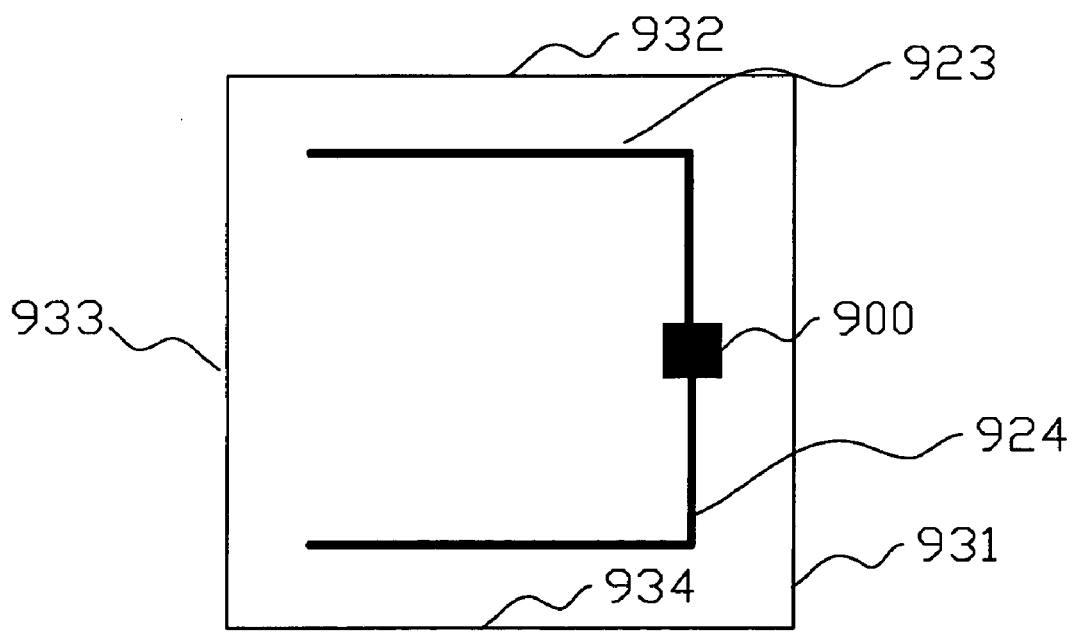
Figure 11C:
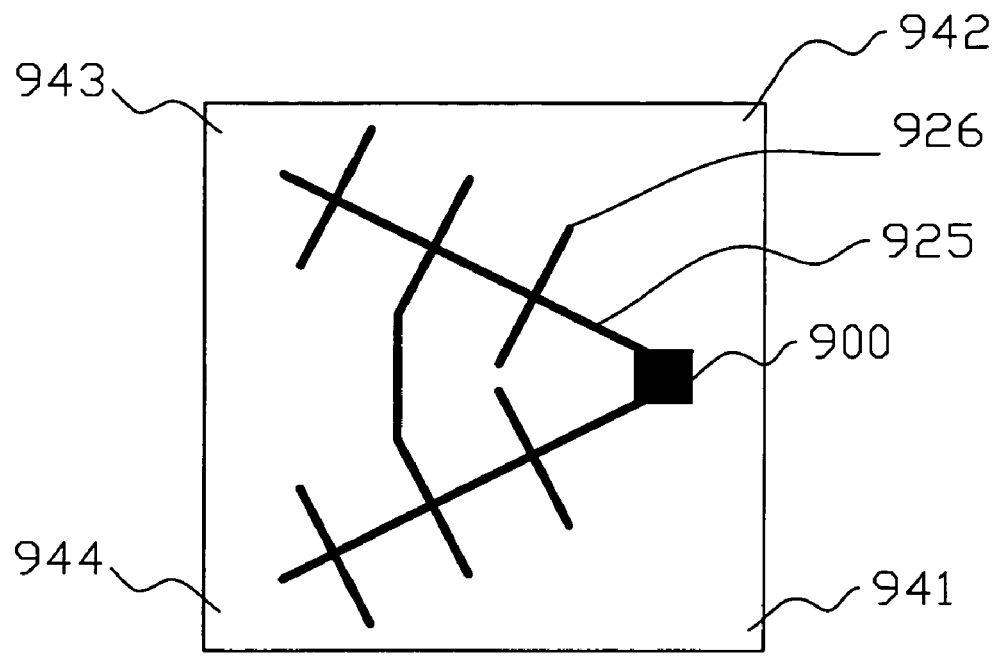

FIGS. 11A-11C still show some embodiments of the p-type metal electrode layer pattern, wherein the channel-connecting portion 900 is located near the middle point of the edge 931. Referring to 11A, a pattern comprises a first finger-shaped electrode 921 extending from the channel-connecting portion 900 toward the opposite edge and at least one second finger-shaped electrode 922 extending from one corner to the diagonal corner. FIG. 11B shows a p-type metal electrode layer pattern comprising two finger-shaped electrodes 923 and 924 wherein the finger-shaped electrodes 923 and 924 extend from the channel portion 900 along the edge 931 and then turn along edges 932 and 934 to form a double-armed p-type metal electrode layer pattern. FIG. 11C shows another p-type metal electrode layer pattern comprising at least one finger-shaped electrode 934, 944 and one or plural extension portion(s) 925, wherein the finger-shaped electrodes 934 and 944 extend from the channel-connecting portion 900 toward the corners 933 and 934 which are most far away from the channel-connecting portion 900. Furthermore, the extension portion 925 extends from the finger-shaped electrodes 934 and 944 and is electrically connected between the different finger-shaped electrodes 934 and 944.

Figure 12:
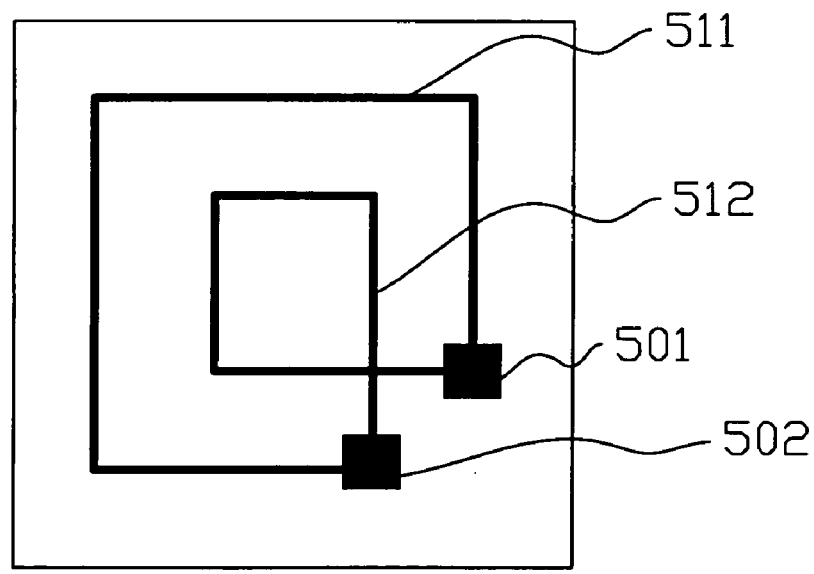
FIG. 12 is the schematic diagram illustrating the embodiments comprising two channel-connecting portions.

This invention discloses another embodiment comprising wherein the optoelectronic device comprises two channels. Referring to FIG. 12, the metal electrode layer pattern in this embodiment comprises two channel-connecting portions 501 and 502, and two rings 511 and 512, wherein the channel-connecting portions 501 and 502 are electrically connected to the channels, and two rings 511, 512.

The number of the channel in the present invention is not limited by the aforementioned embodiments and can be single or plural. Moreover, the position and the pattern design between the n-type metal electrode layer 33 and the p-type metal electrode layer 32 may be staggered, overlapped entirely, or overlapped partially.

Figure 13:
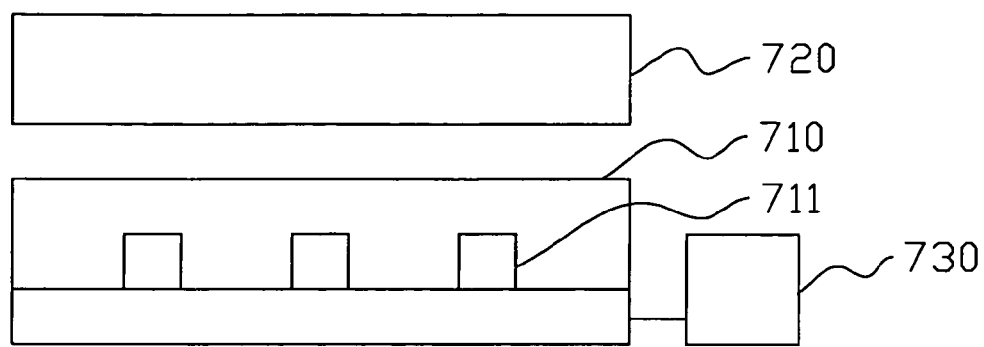
FIG. 13 is the schematic diagrams illustrating the back light module device.

FIG. 13 shows a back light module device. The back light module device comprising a light source like the optoelectronic device or the light-emitting diode chip disclosed in the aforementioned embodiments in this invention, an optical device 720 disposing on the path of the light which light source device 710 emits, and a power supply system 730 for providing the power into the light source device 710.

Figure 14:
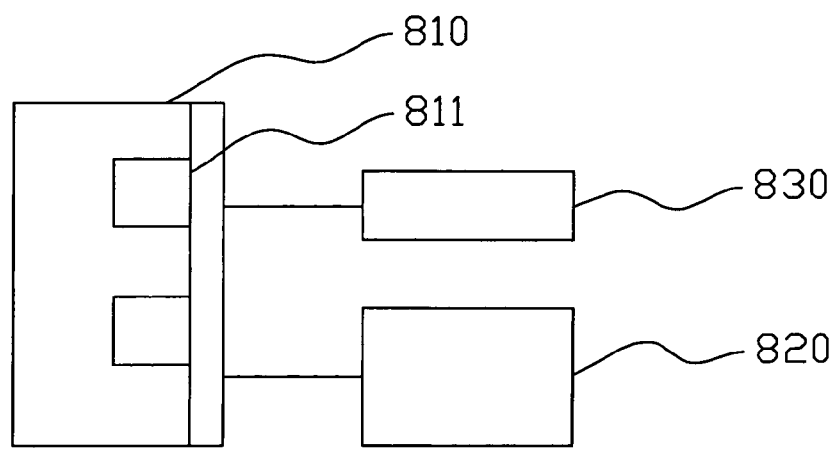
FIG. 14 is the schematic diagrams illustrating the luminous device.

FIG. 14 shows a luminous device. The luminous device may be a car lump, a street lamp, a flashlight, and an indicating lump. The luminous device comprises a light source device 810 like the optoelectronic device or the light-emitting diode chip disclosed in the aforementioned embodiments in this invention, a power supply system 820 for providing the power into the light source device 810, and a controller 830 for controlling the input power from the power supply system 820 into the light source device 810.

The foregoing description has been directed to a specific embodiment of this invention. It will be apparent; however, that other variations and modifications may be made to the described embodiments, with the attainment of some or all of their advantages. Therefore, it is the object of the appended claims to cover all such variations and modifications that fall within the spirit and scope of the invention.

What is claimed is:

1. The optoelectronic device, comprising:
a multi-layer epitaxy layer, comprising a first conductive type semiconductor layer, an active layer, and a second conductive type semiconductor layer, wherein the first conductive layer comprises a first side and a second side;
a first metal electrode layer with a first pattern located on the first side of the first conductive type semiconductor layer, wherein the first metal electrode layer comprises a plane;
a first bonding pad located on a second side of the first conductive type semiconductor layer; and
a channel passing through the first conductive type semiconductor layer to electrically connect the first bonding pad and the first conductive type semiconductor layer, wherein the channel is connected to the first pattern,
wherein the first pattern comprises a channel connecting portion which is electrically connected to the channel and a finger-shaped electrode which is connected to the channel connecting portion.

2. The optoelectronic device according to claim 1, wherein the plane comprises a center, four corners, and four edges.

3. The optoelectronic device according to claim 2, wherein the first pattern comprises one or plural ring(s) which are connected to the channel-connecting portion.

4. The optoelectronic device according to claim 2, wherein the first pattern comprises a spiral shape which is connected to the channel-connecting portion.

5. The optoelectronic device according to claim 2, wherein the finger-shaped electrode extends toward one of the corners.

6. The optoelectronic device according to claim 2, wherein the finger-shaped electrode extends along one of the edges parallelly or vertically.

7. The optoelectronic device according to claim 2, wherein the first pattern is a mesh-shaped pattern.

8. The optoeletronic device according to claim 1 wherein the plane comprises a center, four corners, and four edges, wherein the channel-connecting portion is located on one of the four corners.

9. The optoelectronic device according to claim 8, wherein the finger-shaped electrode is vertical or parallel to one of the four edges or extending toward one of the corners.

10. The optoelectronic device according to claim 1, wherein the channel-connecting portion is located on the middle point of a first edge.

11. The optoelectronic device according to claim 10, wherein the finger-shaped electrode extends along the first edge to form a double-armed pattern, or toward a second edge which is opposite to the first edge, or toward the corner which is most away from the channel-connecting portion.

12. The optoelectronic device according to claim 1, wherein the channel is single or plural.

13. The optoelectronic device according to claim 1, the optoelectronic device further comprises a second metal electrode layer which is electrically connected to the second conductive type semiconductor layer and the second bonding pad, wherein the second metal electrode layer comprises a second pattern and the first pattern is totally overlapped, totally staggered, or patially overlapped to the second pattern.

* * * * *

UNITED STATES PATENT AND TRADEMARK OFFICE
CERTIFICATE OF CORRECTION

| | | |
|---|---|---|
| PATENT NO. | : 7,777,240 B2 | Page 1 of 1 |
| APPLICATION NO. | : 12/318195 | |
| DATED | : August 17, 2010 | |
| INVENTOR(S) | : Jin-Ywan Lin et al. | |

It is certified that error appears in the above-identified patent and that said Letters Patent is hereby corrected as shown below:

Please add the following on the cover of the Letters Patent:

--(30)   Foreign Application Priority Data

March 19, 2007   (TW) ...................................... 096109432--

Signed and Sealed this

Sixteenth Day of November, 2010

David J. Kappos
*Director of the United States Patent and Trademark Office*